US012663453B2

(12) United States Patent
Marnat et al.

(10) Patent No.: US 12,663,453 B2
(45) Date of Patent: Jun. 23, 2026

(54) ELECTROMAGNETIC FIELD PROBE

(71) Applicant: Commissariat à l'Energie Atomique et aux Energies Alternatives, Paris (FR)

(72) Inventors: Loïc Marnat, Grenoble (FR); Camille Jouvaud, Grenoble (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 83 days.

(21) Appl. No.: 18/292,727

(22) PCT Filed: Jul. 19, 2022

(86) PCT No.: PCT/EP2022/070205
§ 371 (c)(1),
(2) Date: Jan. 26, 2024

(87) PCT Pub. No.: WO2023/006506
PCT Pub. Date: Feb. 2, 2023

(65) Prior Publication Data
US 2024/0280621 A1 Aug. 22, 2024

(30) Foreign Application Priority Data
Jul. 27, 2021 (FR) ..................................... 2108129

(51) Int. Cl.
*G01R 29/08* (2006.01)
*H01Q 1/36* (2006.01)
(Continued)

(52) U.S. Cl.
CPC ................................. *G01R 29/0878* (2013.01)

(58) Field of Classification Search
CPC . G01R 29/08; H01Q 1/36; H01Q 1/38; H01Q 1/48; H01Q 1/50
See application file for complete search history.

(56) References Cited

U.S. PATENT DOCUMENTS 4,686,491 A 8/1987 Howard
5,459,441 A 10/1995 Weber et al.
(Continued)

FOREIGN PATENT DOCUMENTS

EP 3671953 A1 6/2020
WO 2020073643 A1 4/2020
WO 2023006506 A1 2/2023

OTHER PUBLICATIONS

Translation of the International Preliminary Report on Patentability for International application No. PCT/EP2022/070205; mailed Nov. 4, 2022; 7 pages.
(Continued)

*Primary Examiner* — Neel D Shah
(74) *Attorney, Agent, or Firm* — Jordan IP Law LLC

(57) ABSTRACT

The present description relates to an electromagnetic field probe (10) comprising: a ground plane (12); a capacitive roof (13); the ground plane and the capacitive roof being separated by a dielectric material (14); at least three vias (110, 111, 112) extending through the dielectric material and comprising at least one excitation via and at least one grounding via arranged so as to form, when the at least one excitation via is powered, two current loops, each current loop extending in the plane of the capacitive roof and in a direction orthogonal to said capacitive roof, so as to be sensitive to a magnetic field (H1, H2) parallel to the plane of the capacitive roof, the current loops having directions orthogonal to each other in the plane of the capacitive roof.

15 Claims, 6 Drawing Sheets

BB cross-section 12

(51) Int. Cl.
  *H01Q 1/38*      (2006.01)
  *H01Q 1/48*      (2006.01)
  *H01Q 1/50*      (2006.01)

(56)          References Cited

U.S. PATENT DOCUMENTS

| | | | |
|---|---|---|---|
| 6,750,825 B1 * | 6/2004 | Delaveaud | H01Q 5/357 |
| | | | 343/749 |
| 2018/0183148 A1 | 6/2018 | Pan et al. | |
| 2019/0044234 A1 | 2/2019 | Isom | |
| 2020/0203838 A1 * | 6/2020 | Delaveaud | H01Q 9/36 |
| 2020/0328516 A1 * | 10/2020 | Kakuya | H01Q 9/0407 |

OTHER PUBLICATIONS

International Search Report for International Application No. PCT/EP2022/070205 dated Nov. 4, 2022, 3 pages.

Delaveaud, C., and S. Sufyar. "A miniaturization technique of a compact omnidirectional antenna." In 2009 3rd European Conference on Antennas and Propagation, pp. 384-388. IEEE, 2009.

Lee, Sang-Ho, TaeckKeun Oh, and Yongshik Lee. "Enhancement of cross-polarization discrimination in a dual-polarization slot antenna." In 2015 International Workshop on Antenna Technology (iWAT), pp. 291-293. IEEE, 2015.

Batel, Lotfi, Christophe Delaveaud, and Jean-François Pintos. "Miniaturization strategy of compact antenna using magneto-dielectric material." In 2019 13th European Conference on Antennas and Propagation (EuCAP), pp. 1-5. IEEE, 2019.

Yang, Shing-Lung Steven, Ahmed A. Kishk, Kai-Fong Lee, Kwai-Man Luk, and Hau-Wah Lai. "The design of microstrip patch antenna with four polarizations." In 2008 IEEE Radio and Wireless Symposium, pp. 467-470. IEEE, 2008.

* cited by examiner

BB cross-section

CC cross-section

ELECTROMAGNETIC FIELD PROBE

BACKGROUND

The present disclosure generally concerns the field of electromagnetic field probes. It particularly applies to wireless information transmissions, particularly in environments, such as at least partially closed cavities, where the distribution of the magnetic and electric fields is not homogeneous.

In the field of information transmissions, and more specifically of wireless transmissions using electromagnetic waves, certain environments are such that the distribution of the magnetic and electric fields is not always homogeneous. This may in particular occur when information is desired to be transmitted in at least partially closed environments, having dimensions relative to the wavelength of the electromagnetic field (electrical dimensions) greater than a physical limit. An example of environment concerns a metal cavity at least partially closed over at least a given length.

To transmit information within such a metal cavity, it is typical to use a tip- or strand-type probe (for the electric field) and/or a loop-type probe (for the magnetic field) to excite a mode of establishment of the electromagnetic field and to couple to the electromagnetic field generated in return in the cavity. It is then possible to communicate between two points of the cavity, provided that the probe(s) couple(s) with the established mode(s) of the electromagnetic field in the cavity.

Now, in a closed cavity, the orientation and the distribution of the electric and magnetic fields are mainly governed by the size and shape of the cavity, as well as by the materials forming it. For example, for a closed cavity having at least one transverse dimension in the order of half the wavelength of the electromagnetic field, the electric and magnetic fields may be established in almost homogeneous fashion (mode called "fundamental"). Conversely, when the two transverse dimensions of a closed cavity are greater than approximately half the wavelength of the electromagnetic field, non-homogeneous electric and magnetic field distributions exhibiting minimum and maximum values appear (modes said to be of "higher orders"), with areas where the electric and/or the magnetic field is very low, or even zero, and other areas where the electric and/or magnetic field is very high.

Further, the distribution of electric and magnetic fields varies according to the frequency of the electromagnetic field in the cavity. For a same size and a same shape of the cavity, the more the frequency increases, the more higher-order modes appear, and the less homogeneous the fields become in the cavity. A corollary is that the higher the frequency, the greater the probability of encountering field drops (or "nulls").

These phenomena make wireless information transmission dependent on the position of a probe in the cavity. In other words, these phenomena have a direct impact on the ability to transmit and/or to receive information at any point of the cavity.

Certain solutions provide arranging a plurality of probes of tip (or strand) and/or loop type at different locations in the cavity, in order to take into account higher-order modes in the cavity. Certain solutions provide adapting the shape of the probes, particularly in order to excite a defined mode of field establishment, which may induce assembly and/or manufacturing issues, especially when the probes have complex shapes.

Further, adapting the shape of the probes is generally not sufficient to do away with the need for at least two probes in the cavity: a probe sensitive to the electric field and another probe sensitive to the magnetic field. Indeed, a near-field transmission requires being able to sense both the electric field and the magnetic field. Now, in near field (for example in a metal cavity), unlike in far field, the electric and magnetic fields are not necessarily related, and being able to capture a single one of the electric or magnetic fields is generally not sufficient to robustly and continuously transmit information at any point of the considered environment.

Further, known probes generally remain sensitive to the orientation of the magnetic field, so that certain orientations of the magnetic field cannot or only with difficulty be captured by these probes.

SUMMARY

There exists a need for an electromagnetic field probe which can be sensitive to the two components formed by the electric field and the magnetic field at any point of the volume of an environment (for example, a cavity), and which is adapted to transmitting information in the considered environment, especially an environment where the distribution of magnetic and electric fields is not always homogeneous. In particular, there exists a need for an electromagnetic field probe that can operate irrespective of the orientation of the magnetic field in the plane of the probe.

It would be advantageous to have such a probe, further enabling to keep a sufficient level of transmission at any point of the environment, whatever the operating frequencies of the probe, particularly outside the frequencies of coupling with the transmission modes of the electromagnetic field in the considered environment.

It would also be advantageous to have such a probe having an input and/or output impedance as well as a radiation efficiency which can be adjusted.

It would further be advantageous for such a probe to have decreased dimensions, so that it can be integrated in any type of environment and/or any type of transmission system.

An embodiment overcomes all or part of the disadvantages of known electromagnetic field probes.

An embodiment provides an electromagnetic field probe extending along a main plane and comprising:

an electrically-conductive ground plane;

an electrically-conductive capacitive roof, arranged at a distance from the ground plane; the ground plane and the capacitive roof being separated, at least over a portion of their interface, by a dielectric material;

at least three electrically-conductive vias extending through the dielectric material, each of said at least three vias being either an excitation via electrically coupled to the capacitive roof, electrically insulated from the ground plane, and intended to be coupled to an electric power source, or a grounding via electrically coupling the ground plane and the capacitive roof, the at least three vias comprising at least one excitation via and at least one grounding via; the at least three vias being arranged to form, when the at least one excitation via is powered, a first current loop and a second current loop, each current loop extending in the plane of the capacitive roof and in a direction substantially orthogonal to said capacitive roof, so as to be sensitive to a magnetic field substantially parallel to the plane of the capacitive roof, the first and second current loops having directions substantially orthogonal to each other in the plane of the capacitive roof.

According to an embodiment, the at least three electrically-conductive vias comprise: an excitation via, a first grounding via, and a second grounding via; the first current loop running between the excitation via, the capacitive roof, and the first grounding via; the second current loop running between the excitation via, the capacitive roof, and the second grounding via.

According to a specific embodiment, the straight line coupling a connection point of the first grounding via in the plane of the capacitive roof and a connection point of the excitation via in the plane of the capacitive roof is substantially orthogonal to the straight line coupling a connection point of the second grounding via in the plane of the capacitive roof and a connection point of the excitation via in the plane of the capacitive roof.

According to an embodiment, the at least three electrically-conductive vias comprise: a grounding via, a first excitation via, and a second excitation via; the first current loop running between the first excitation via, the capacitive roof, and the grounding via; the second current loop running between the second excitation via, the capacitive roof, and the grounding via.

According to a specific embodiment, the straight line coupling a connection point of the first excitation via in the plane of the capacitive roof and a connection point of the grounding via in the plane of the capacitive roof is substantially orthogonal to the straight line coupling a connection point of the second excitation via in the plane of the capacitive roof and a connection point of the grounding via in the plane of the capacitive roof.

According to an embodiment, the probe comprises a slot formed by an opening crossing the entire thickness of the capacitive roof.

According to a specific embodiment, the slot exhibits an axial symmetry with respect to a straight line running through the connection point of the excitation via in the plane of the capacitive roof and running substantially at an equal distance from the connection point of the first grounding via in the plane of the capacitive roof and from the connection point of the second grounding via in the plane of the capacitive roof.

According to another specific embodiment, the slot exhibits an axial symmetry with respect to a straight line running through the connection point of the grounding via in the plane of the capacitive roof and running substantially at an equal distance from the connection point of the first excitation via in the plane of the capacitive roof and from the connection point of the second excitation via in the plane of the capacitive roof.

According to an embodiment, the probe further comprises at least one complementary electrically-conductive via, the at least one complementary via being a complementary grounding via or a complementary excitation via.

According to an embodiment, the dielectric material is air.

According to another embodiment, the dielectric material is a substrate, for example an organic substrate or a ceramic substrate.

According to an embodiment, the dimensions of the probe in the main plane are smaller than one quarter of the wavelength of use of said probe, for example in the range from one twentieth to one quarter of the wavelength of use of said probe, or even in the range from one twentieth to one tenth of the wavelength of use of said probe.

According to an embodiment, the height of the probe is smaller than one thirtieth of the wavelength of use of said probe, for example in the range from one hundredth to one thirtieth of the wavelength of use of said probe, or even in the range from one hundred and fifth and to one thirtieth of the wavelength of use of said probe.

According to an embodiment, the ground plane is parallel to the capacitive roof.

An embodiment provide a method of manufacturing an electromagnetic field probe, comprising:
    a step of provision of an electrically-conductive ground
        plane;
    a step of provision of an electrically-conductive capaci-
        tive roof;
    a step of arrangement of the capacitive roof at a distance
        from the ground plane;
    a step of coupling of at least one excitation via to the
        capacitive roof, said at least one excitation via being
        electrically insulated from the ground plane;
    a step of coupling of at least one grounding via to the
        ground plane and to the capacitive roof; the number of
        excitation and grounding vias being at least equal to
        three;
    said excitation and grounding vias being arranged so as to
        form, when an excitation via is powered, a first current
        loop and a second current loop, each current loop
        extending in the plane of the capacitive roof and in a
        direction substantially orthogonal to said capacitive
        roof, so as to be sensitive to a magnetic field substan-
        tially parallel to the plane of the capacitive roof, the
        first and second current loops having directions sub-
        stantially orthogonal to each other in the plane of the
        capacitive roof.

For all the embodiments, a considered environment is, for example, an at least partially closed cavity, such as a metal cavity.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION OF THE PRESENT EMBODIMENTS

Figure 1A:
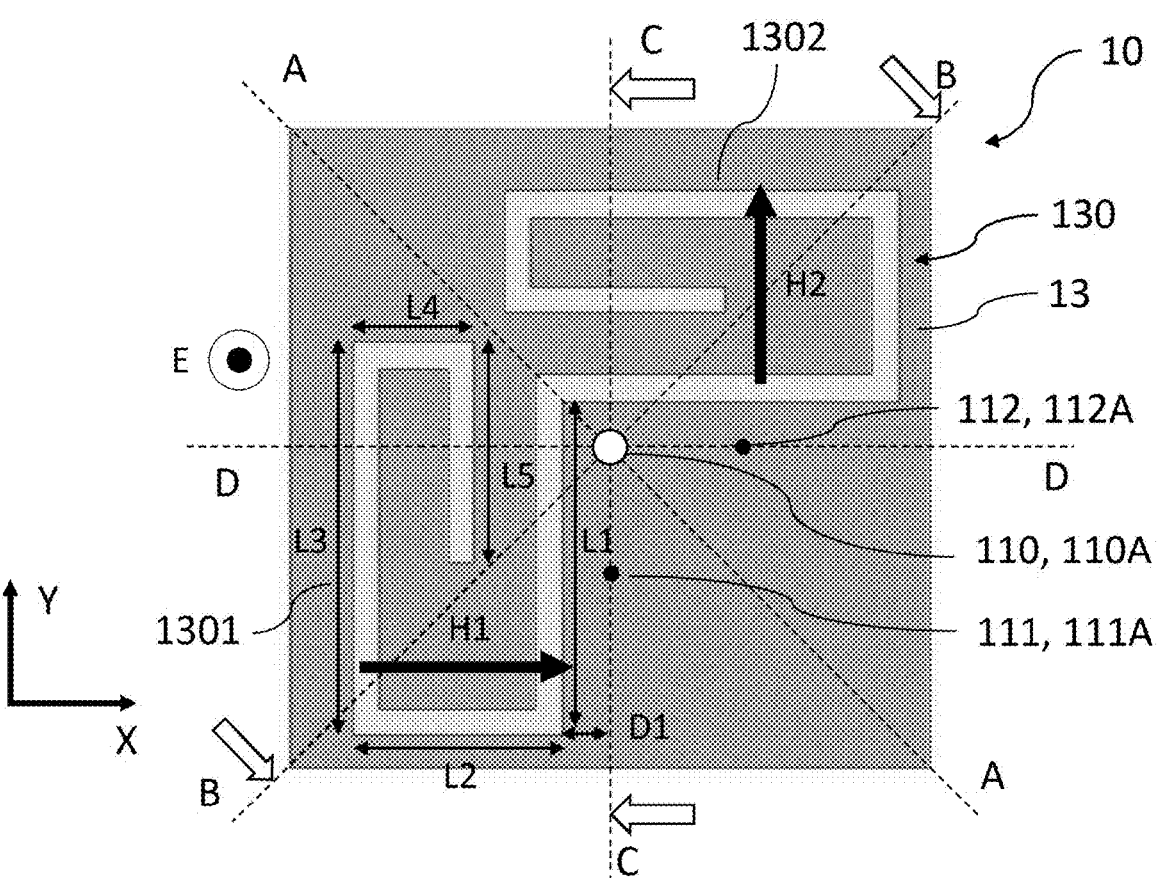
FIG. 1A shows a probe according to an embodiment in top view (main plane)

Like features have been designated by like references in the various figures. In particular, the structural and/or functional features that are common among the various embodiments may have the same references and may dispose identical structural, dimensional and material properties.

For the sake of clarity, only the steps and elements that are useful for the understanding of the described embodiments have been illustrated and described in detail. In particular, the power supply of the excitation vias is generally not described, being within the abilities of those skilled in the art in the field of the invention.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "edge", "back", "top", "bottom", "left", "right", etc., or relative positions, such as terms "above", "under", "upper", "lower", etc., or to terms qualifying directions, such as terms "horizontal", "vertical", etc., it is referred, unless specified otherwise, to the orientation of the drawings or to a probe in a normal position of use.

The dimensions of a probe in the main plane, designated by XY in the drawings, correspond to the dimensions in two perpendicular directions of the main plane, for example a first direction X and a second direction Y. For example, for a probe of rectangular shape (for example, square), the dimensions in the main plane correspond to the two sides of the rectangle; for a probe of circular shape, the dimensions in the main plane correspond to the diameter of the circle; for a probe of elliptical shape, the dimensions in the main plane correspond to the two axes of the ellipse.

The wavelength of use of a probe is defined as follows: if the probe is designed to operate at a wavelength, then the wavelength of use of the probe is this wavelength.

Unless specified otherwise, the expressions "about", "approximately", "substantially", and "in the order of" signify plus or minus 10%, preferably of plus or minus 5%.

Figure 1B:
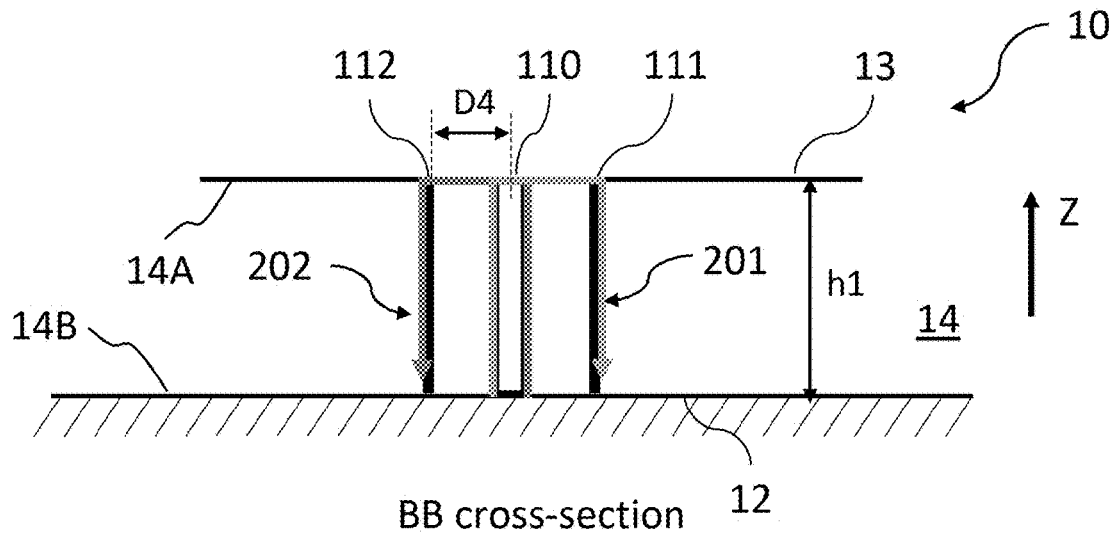
FIG. 1B shows the probe of FIG. 1A in cross-section view along a plane perpendicular to the main plane (cross-section BB)
Figure 1C:
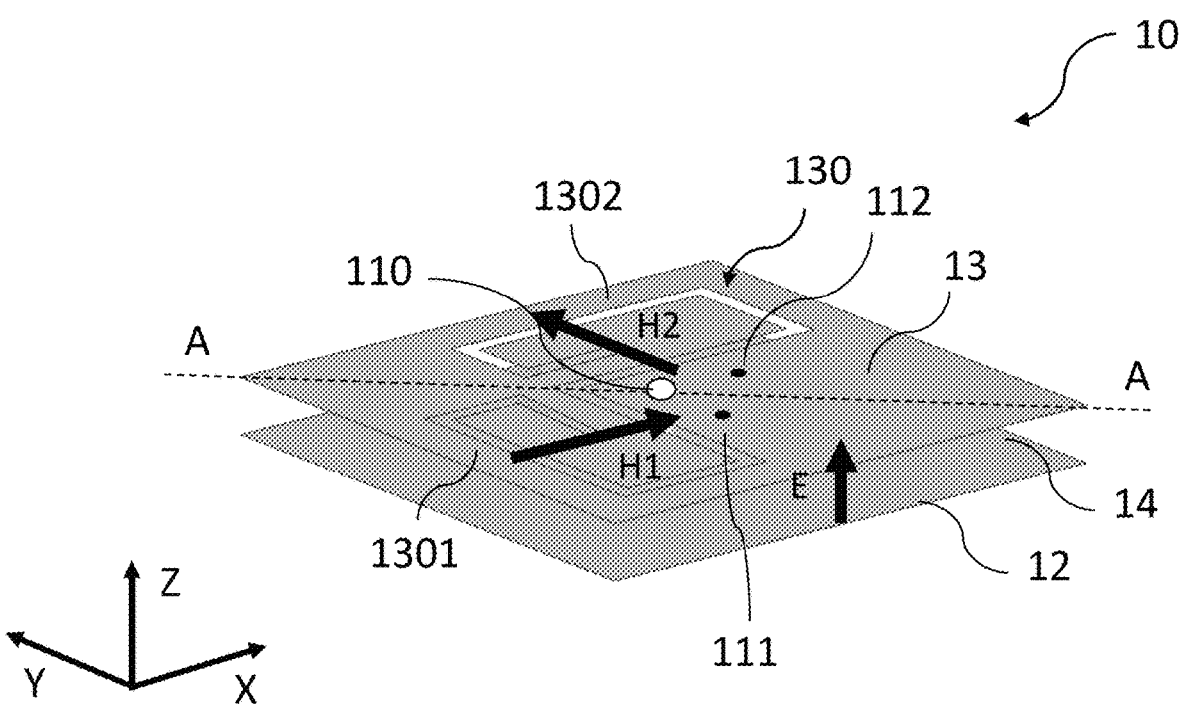
FIG. 1C shows the probe of FIG. 1A in a 3D view.

FIGS. 1A, 1B and 1C show three views of a probe 10 according to an embodiment: a top view (main plane), a cross-section BB in a plane perpendicular to main plane XY, and a 3D view.

The shown electromagnetic field probe 10 shown comprises:
a ground plane 12;
a capacitive roof 13 arranged at a distance from ground plane 12; ground plane 12 and capacitive roof 13 being separated by a dielectric material 14;
three electrically-conductive vias 110, 111, 112 running through dielectric material 14, the three vias being:
an excitation via 110 electrically coupled to capacitive roof 13 and capable of being coupled to an electric power source;
a first grounding via 111; and
a second grounding via 112,
the grounding vias being capable of electrically coupling ground plane 12 and capacitive roof 13.
Excitation via 110 is not electrically coupled to ground plane 12.

For simplification, the grounding vias can be designated as "ground vias". A grounding via has the function of forming a short circuit between ground plane 12 and capacitive roof 13.

Capacitive roof 13 is electrically conductive and preferably takes a planar shape (for example in the form of a plate or of a metal deposit on a substrate). Ground plane 12 is electrically conductive and preferably takes a planar shape (for example in the form of a plate or of a metal deposit on a substrate). Capacitive roof 13 is preferably substantially parallel to ground plane 12.

The probe extends along a main plane XY. Capacitive roof 13 being parallel to ground plane 12, it is considered that the capacitive roof, the ground plane, and thus the probe, extend along a same main plane XY (with a thickness equal to the distance between the ground plane and the capacitive roof, to which are added the thicknesses of the ground plane and of the capacitive roof).

Ground plane 12, capacitive roof 13, and each via may each be at least partially, in non-limiting fashion, made of metal, for example copper, aluminum, or steel.

In the shown example, the straight line CC coupling the connection point 111A of first ground via 111 in the plane of capacitive roof 13 and the connection point 110A of excitation via 110 in the plane of capacitive roof 13 is substantially orthogonal to the straight line DD coupling the connection point 112A of second ground via 112 in the plane of capacitive roof 13 and the connection point 110A of excitation via 110 in the plane of capacitive roof 13.

In other words, the shown capacitive roof 13 being square-shaped, the second ground via 112 is located symmetrically to the first ground via 111 with respect to the diagonal AA (or axis of symmetry AA) of capacitive roof 13 running through the connection point 110A of excitation via 110 in the plane of the capacitive roof. On the other hand, the first 111 and second 112 grounding vias are not arranged according to a central symmetry with respect to excitation via 110, to be able to capture the magnetic field in two different directions of main plane XY, as explained hereafter.

This arrangement of the three excitation and ground vias enables, when excitation via 110 is powered, to form two current loops 201, 202 running through the plane of the capacitive roof and in a direction substantially orthogonal to capacitive roof 13.

For simplification, it may be described that each current loop is substantially orthogonal to the ground plane, although it also runs through the plane of the capacitive roof. By loop substantially orthogonal to the ground plane, it should in particular be understood that the power supply loop extends along a profile included, or capable of being orthogonally projected, in a plane orthogonal to the ground plane. In other words, the profile of such a loop may run, according to the length of the loop, within a plane substantially orthogonal to the ground plane.

Thus, each current loop extends vertically (along direction Z) and along a direction of main plane XY, the two current loops having directions substantially orthogonal to each other in main plane XY. Thereby, the first current loop 201 is sensitive to the magnetic field H1 in the first direction X of main plane XY, and the second current loop 202 is sensitive to the magnetic field H2 in the second direction Y of main plane XY, as will be explained hereafter. It is specified that the second direction Y is orthogonal to the first direction X.

Further, capacitive roof 13 comprises a slot 130 corresponding to an opening across the entire thickness of the capacitive roof, and having two portions 1301, 1302 substantially symmetrical to each other with respect to axis of symmetry AA. Each portion has the shape of a rectangular spiral forming a 45° angle with axis of symmetry AA. This spiral shape enables to obtain a significant slot length even when the dimensions of the capacitive roof are decreased. The increase in the slot length enables to decrease the operating frequency of the probe. More generally, the presence and the sizing of a slot in the capacitive roof makes it possible to adjust the operating frequency of the probe. In particular, the length of the slot has an impact on the resonance frequency of the probe.

This example of a slot shape is not limiting and other slot shapes are possible to obtain a given slot length. For example, the slot may have other rectilinear shapes, other spiral shapes, or meandering shapes. The slot may be divided into a plurality of sections coupled to one another to form a continuous slot.

The presence of a slot further enables to decrease the electrical dimensions of a probe according to embodiments.

The presence and the sizing of a slot also enable to adjust to a given value the input impedance (and/or the output impedance) of a probe according to different embodiments. This sizing is performed by taking into account the propagation of currents on the capacitive roof and by modifying it to obtain a desired input impedance (and/or output impedance). The slot may be sized to adjust the input impedance of a probe to a given value, for example 50 Ohms, which is a typical impedance in the field of wireless information transmissions.

In addition to the parameters linked to the presence of a slot (which is not always required), a probe according to different embodiments has a plurality of design parameters to be able to act on all or part of its features, particularly on its working frequency and wavelength, its input impedance, its output impedance, and/or its radiation efficiency:

the diameters of the vias: mainly enable to act on the impedance of the probe;

the distances between vias: mainly enable to act on the impedance of the probe;

the dimensions of the probe/of the capacitive roof: mainly enable to act on the resonance frequency of the probe;

the height of the probe: mainly enables to act on the bandwidth of the probe (quality factor);

the selection of the dielectric material: mainly enables to act on the resonance frequency of the probe.

In particular, the diameters of the vias and the distances between vias may enable to adjust the input impedance of the probe so that it is matched, for example, to that of a measurement system (for example, a sensor), and/or to that of a communicating system (for example, an RFIC radio frequency chip).

The dimensions in the main plane of the ground plane are greater than, or for example equal to, those of the capacitive roof.

Thus, it is possible to adapt the probe, particularly to all sorts of environments, constraints, and/or applications, by acting, during its design, on all or part of the parameters listed hereabove.

In particular, the dielectric material may be:

air;

a dielectric substrate, for example:

an organic substrate, for example a Rogers 4003® substrate, a duroid 5880® substrate, an FR4 substrate;

a ceramic substrate, for example a Rogers Curamik® substrate, or a Low Temperature Cofired Ceramic (LTCC) substrate.

A dielectric substrate may be formed of a stacking of a plurality of layers of dielectric materials, possibly with different dielectric materials, or even mixed organic/ceramic materials.

When the dielectric material is air, the vias may fulfil a function of mechanical support of the capacitive roof on the ground plane. When the dielectric material is air, pillars made of an insulating material, for example made of plastic or of nylon, may be added between the ground plane and the capacitive roof to reinforce the mechanical holding of the capacitive roof on the ground plane. These pillars may be placed under the capacitive roof or on the edges of said roof.

The ground and excitation vias may have different profiles (circular, polygonal, . . . ). When the vias are of circular type, as in the shown example, their diameters may be in the order of 1 mm or in the range from 100 μm to 5 mm.

The electrical dimensions of the probe (relative to the operating wavelength of the probe) in the plane may be in the range from $\frac{1}{20}$ to $\frac{1}{4}$, or even in the range from $\frac{1}{20}$ to $\frac{1}{10}$, or also in the range from $\frac{1}{20}$ to $\frac{1}{15}$.

The electrical height of the probe (relative to the operating wavelength of the probe) is preferably smaller than or equal to $\frac{1}{30}$. Thus, the probe has a height, relative to its operating wavelength, much lower than current heights. It may be in the range from $\frac{1}{150}$ to $\frac{1}{30}$, or even in the range from $\frac{1}{100}$ to $\frac{1}{30}$, for example substantially equal to $\frac{1}{100}$.

Thus, the probe may have decreased dimensions. For example, the dimensions may be decreased without it being necessary to increase the number of grounding vias and/or without it being necessary to arrange the grounding vias within a magneto-dielectric material. Thus, the dielectric material between the ground plane and the capacitive roof may be air or a non-necessarily magnetic dielectric material. The probe may in particular be integrated in different types of environments and/or of transmission systems.

Figure 2:
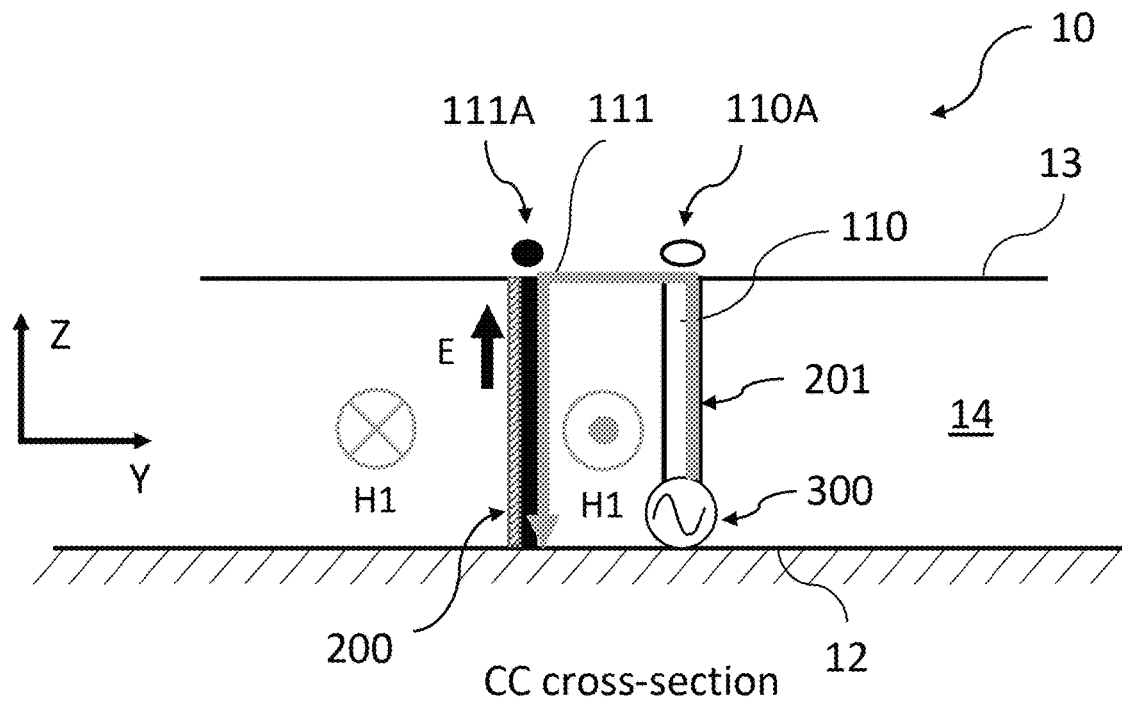
FIG. 2 shows a schematic diagram of a probe according to an embodiment.

As an example, the probe 10 of FIG. 2 may be intended to operate at a 433-MHz frequency. The dimensions of the probe in main plane XY, equivalent in this example to the dimensions of the capacitive roof, may be 40×40 mm². The height h1 of the probe may be 4 mm. The diameters of the vias may be 1.5 mm for the excitation via and 0.3 mm for the ground vias, and the distance D4 between each ground via and the excitation via may be 8 mm. The slot length may be equal to 164.4 mm and the width equal to 1.65 mm. This length may be obtained by forming two rectangular spirals with five segments, two consecutive segments being coupled perpendicularly to each other as illustrated in FIG. 1A, each spiral comprising: a first segment having a length L1 equal to 21 mm, a second segment having a length L2 equal to 13.15 mm, a third segment having a length L3 equal to 24.65 mm, a fourth segment having a length L4 equal to 11.2 mm, and a fifth segment having a length L5 equal to 12.2 mm. First spiral 1301 is at a distance D1 from line CC. The second spiral is distant by a same distance D1 from line DD. In the example, distance D1 is equal to 3 mm.

FIG. 2 shows the schematic diagram of a probe, taking as an example the probe 10 of FIGS. 1A to 1C, although the schematic diagram may be applied to a probe according to another embodiment. The probe shown in the schematic diagram is a probe of FIGS. 1A to 1C in cross-section view CC along a plane perpendicular to the main XY plane (the cross-section plane is visible in FIG. 1A).

Excitation via 110, when it is powered by a power source 300, generates a first current 200 which concentrates in first ground via 111, which makes the probe sensitive to vertical electric fields E. Further, a second current is generated, which forms a first current loop 201 between excitation via 110, capacitive roof 13, and first ground via 111, making the probe sensitive to magnetic field components H1 along the first direction X of the main plane XY of the probe.

The diagram and the currents described hereabove are equivalent for second ground via 112, a second current loop 202 being formed between excitation via 110, capacitive roof 13, and second ground via 112, which makes the probe sensitive to magnetic field components H2 along the second direction Y of the main plane.

Thus, the probe can omnidirectionally couple to the electromagnetic field: to the vertical electric field E (in direction Z) and to the magnetic field H in main plane XY (being sensitive to the components in the two perpendicular directions X, Y of the plane).

This particularly enables to improve the quality of the transmission of information between different points of an environment, in particular to make transmissions more uniform within the considered environment, and this, without having to multiply the number of probes in said environment.

Figures 3, 4:
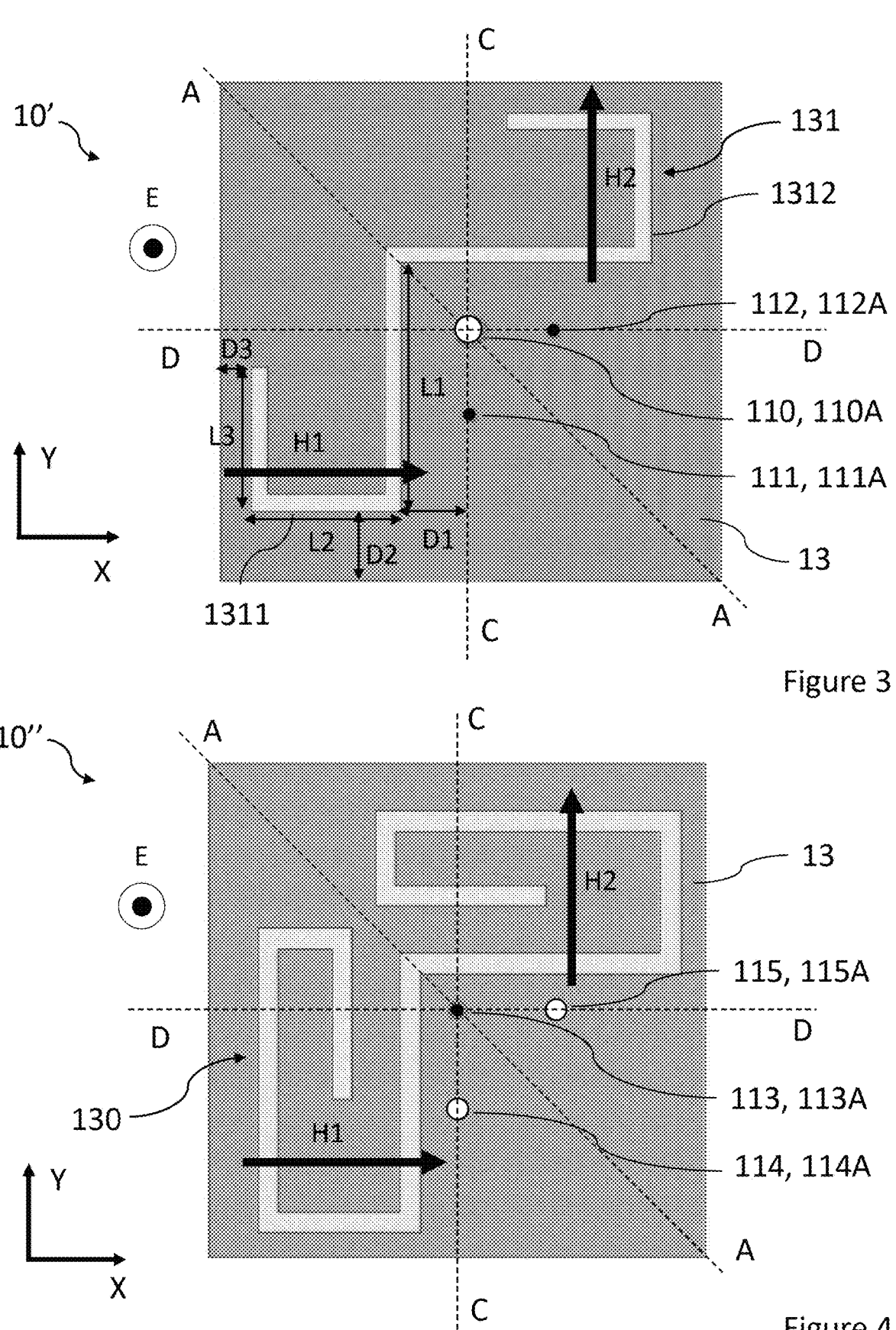
FIG. 3 shows a probe according to another embodiment in top view.
FIG. 4 shows a probe according to another embodiment in top view.

FIG. 3 shows a probe 10' according to another embodiment, in a top view.

The shown probe 10' differs from the probe of FIGS. 1A-1C by the shape of slot 131, and by the decrease in its length. In the same way as for the probe 10 of FIGS. 1A-1C, slot 131 exhibits two portions 1311, 1312 substantially symmetrical with respect to the axis of symmetry AA of capacitive roof 13, each portion forming a 45° angle with said axis of symmetry, but it differs therefrom in that each of the two portions 1311, 1312 is arranged in three segments perpendicularly coupled to one another, thus decreasing the slot length as compared with a slot with five segments. The decrease in the slot length enables to increase the operating frequency of the probe.

The other features, the sizing elements, and the alternatives described in relation with FIGS. 1A-1C as well as the operating diagram of FIG. 2 may be applied to the probe in FIG. 3.

As an example, the probe 10' of FIG. 3 may be intended to operate at a 900-MHz frequency. The dimensions of the probe in main plane XY, equivalent in this example to the dimensions of the capacitive roof, may be 30×30 mm². The height of the probe may be 4 mm. The diameters of the vias may be 1.8 mm for the excitation via and 0.8 mm for the ground vias, and the distance between each ground via and the excitation via may be 5 mm. The slot length may be 65 mm and the width 1 mm. The length can be obtained by forming two rectangular spirals with three segments each, two consecutive segments being coupled perpendicularly to one another as illustrated in FIG. 3, each spiral comprising: a first segment having a length L1 equal to 14.93 mm, a second segment having a length L2 equal to 8.95 mm, and a third segment having a length L3 equal to 8.7 mm. The first spiral 1311 is distant by a distance D1 from straight line CC. The second spiral 1312 is distant by a same distance D1 from straight line DD. In the example, distance D1 is equal to 4.2 mm. Further, each second segment is distant by a distance D2 from the edge of the capacitive roof, for example equal to 4.2 mm, and each third segment is distant by a distance D3 from the edge of the capacitive roof, for example, equal to 1.8 mm.

FIG. 4 shows a probe 10" according to another embodiment in top view.

The shown probe differs from the probe of FIGS. 1A-1C in that it comprises a grounding via 113 and first and second excitation vias 114, 115 (instead of one excitation via 110 and two grounding vias 111, 112 for the probe 10 of FIGS. 1A-1C).

The description of FIG. 2 applies to this other embodiment, except that the first current loop 201 is formed by the first excitation via 114 and the ground via 113 connected to capacitive roof 13, and the second current loop 202 is formed by the second excitation via 115 and the ground via 113 connected to roof 13.

This other embodiment enables to discriminate the two orthogonal components of the magnetic field in main plane XY. Indeed, the proportion of magnetic field H1 oriented along axis X couples with first current loop 201. The magnetic field oriented along axis Y is not, or only lightly, coupled to first current loop 201. Complementarily, the proportion of magnetic field H2 oriented along axis Y couples to second current loop 202. The magnetic field oriented along axis X is not or is very lightly coupled to second current loop 202.

The first and second excitation vias 114, 115 are not electrically coupled to ground plane 12.

In operation, the first and second excitation vias 114, 115 may be powered either by a single power source capable of supplying two currents (which may phase-shifted with respect to each other), or by two independent power sources.

In the shown example, the straight line CC coupling the connection point 114A of first excitation via 114 in the plane of capacitive roof 13 and the connection point 113A of ground via 113 in the plane of capacitive roof 13 is substantially orthogonal to the straight line DD coupling the connection point 115A of second excitation via 115 in the plane of capacitive roof 13 and the connection point 113A of ground via 113 in the plane of capacitive roof 13.

In other words, the shown capacitive roof 13 being square-shaped, second excitation via 115 is located symmetrically to first excitation via 114 with respect to the diagonal (or axis of symmetry) AA of capacitive roof 13 running through the connection point 113A of ground via 113 in the plane of the capacitive roof. On the other hand, the first 114 and second 115 excitation vias are not arranged according to a central symmetry with respect to the grounding via 113, and this, to be able to capture the magnetic field in two different directions of the main XY plane, as explained hereafter.

The other features, the sizing elements, and the alternatives described in relation with FIGS. 1A-1C and 3 may be applied to the probe of FIG. 4.

As concerns the operating diagram in FIG. 2, as described hereabove, it remains basically the same. A difference is that, since there are two excitation vias and a single ground via, when excitation vias 114, 115 are powered by the power source(s), a first current loop 201 is formed between first excitation via 114, capacitive roof 13, and ground via 113, which makes the probe sensitive to magnetic field H1 along the first direction X of the main plane XY of the probe, and a second current loop 202 is formed between second excitation via 115, capacitive roof 13, and ground via 113, which makes the probe sensitive to the magnetic field H2 along the second direction Y of the main plane.

According to other embodiments (not shown), the probe may comprise a fourth via which may be:

a complementary grounding via: according to a variant referring to the embodiment of FIG. 1A-1B or 2, a complementary grounding via may be substantially aligned with first ground via 111 and excitation via 110 or with second ground via 112 and excitation via 110, and this, either on the same side as the first or second ground via with respect to axis of symmetry AA, or on the other side; according to another variant referring to the embodiment of FIG. 3, a complementary grounding via may be substantially aligned with ground via 113 and first excitation via 114 or with ground via 113 and second excitation via 115, and this, either on the same side as the first or second excitation via with respect to axis of symmetry AA, or on the other side;

a complementary excitation via: according to a variant referring to the embodiment of FIG. 1A-1B or 2, a complementary excitation via may be substantially aligned with first ground via 111 and excitation via 110 or with second ground via 112 and excitation via 110, and this, either on the same side as the first or second ground via with respect to the axis of symmetry AA, or on the other side; in this case, all the excitation vias of the same current loop 201 and 202 are electrically connected together.

A complementary grounding via for example enables to mainly control the amplitude of the resonance of the probe, and a complementary excitation via for example enables to control the imaginary part of the input impedance of the probe.

In the probes of FIGS. 1A, 1B, 1C, 3, and 4, the capacitive roof preferably has a substantially square shape, but the embodiments are of course not limited to this type of shape. The capacitive roof may for example have a polygonal shape other than square, a circular or oval shape, or any other suitable shape.

Examples of methods of manufacturing a probe according to an embodiment are disclosed in the following. It can be referred to FIGS. 1A, 1B, 1C, 3 and 4 for the reference numerals.

According to an embodiment, a substrate 14 made of a dielectric material, for example a substrate of FR4 type, is available, then:

in a first step, a metal layer is formed on the lower surface 14B of the substrate to form a ground plane 12 according to defined dimensions;

in a second step, a metal layer is formed on the upper surface 14A of the substrate to form a capacitive roof 13 according to defined dimensions;

in a third step, and in certain cases, a slot 130, 131 is formed across the thickness of capacitive roof 13 with a defined length and pattern;

in a fourth step, there are formed in the dielectric substrate ground vias 111, 112 (or one ground via 113) electrically coupling ground plane 12 and capacitive roof 13, as well as one excitation via 110 (or excitation vias 114, 115) electrically coupled to capacitive roof 13, but electrically insulated from ground plane 12;

in certain cases, in a fifth step (which may be before or after the fourth step), an opening is formed across the thickness of ground plane 12 to make way for the excitation via 110 (or in certain cases, a plurality of openings to make way for a plurality of excitation vias 114, 115), and each excitation via is electrically insulated from the ground plane, for example by adding an electrical insulator at each passage of an excitation via through the ground plane.

The first step may comprise a step of metallization of the substrate made of dielectric material entirely on its lower surface to form the ground plane.

The second step may comprise a step of metallization of the substrate made of dielectric material at least partially on its upper surface to form the capacitive roof.

The third step may comprise a step of machining or of etching of the capacitive roof to form the slot.

The fourth step may comprise a step of printing of the vias in the substrate according to techniques known in the field of microelectronics.

According to another embodiment, a substrate in which the two metal layers have already been formed may be used. The first and second steps are then no longer necessary. For example, two single-sided substrates (a metallized surface on an insulating layer) may be used, such as FR4-type substrates. The metallized surface of each substrate may be etched, if required, to form the slot in the substrate forming the capacitive roof and/or to form the opening(s) in the substrate forming the ground plane to make way for the excitation via(s). The two single-sided substrates are then assembled by their insulating layers, each previously coated with a layer of adhesive. The structure thus obtained is then drilled and the holes are metallized to form the ground and excitation vias.

According to another embodiment, no substrate is used, the dielectric material being air. The first and second steps are then suppressed and may be replaced with a step of arrangement of a metal plate to form a ground plane with defined dimensions and another step of arrangement of another metal plate to form a capacitive roof with defined dimensions. Further, according to this embodiment, in the fourth step, the ground and excitation vias are not formed in the substrate. The ground via(s) may be assembled (for example welded or screwed) to the ground plane and to the capacitive roof, and the excitation via(s) may be assembled (for example, welded or screwed) to the capacitive roof while being electrically insulated from the ground plane. To stabilize the structure, pillars made of an insulating material, for example, of plastic or of nylon, may be added between the ground plane and the capacitive roof. These pillars may be placed under the capacitive roof or on the edges of said roof.

Figure 5A:
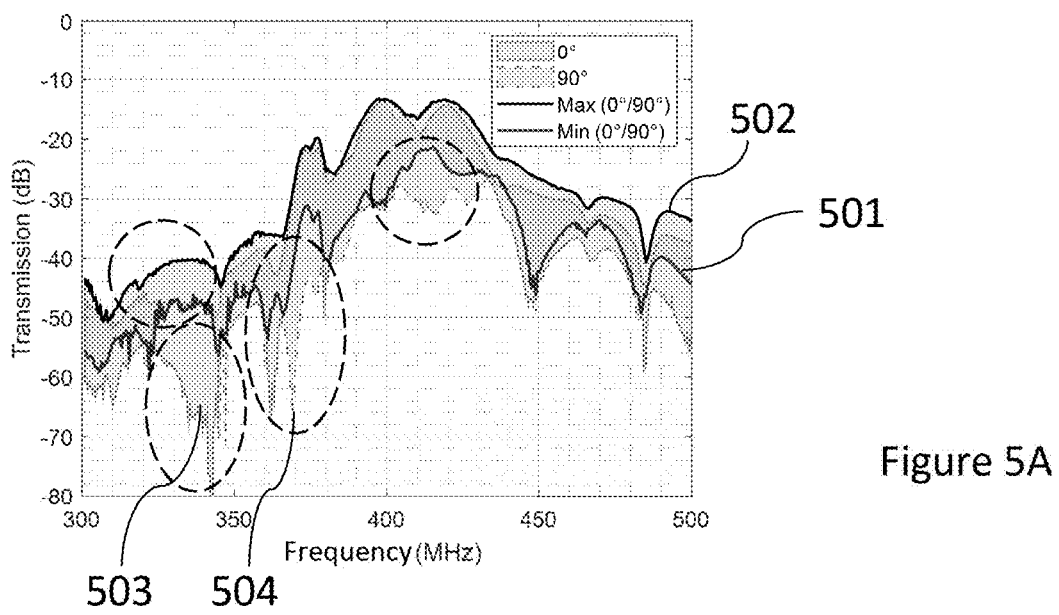
FIG. 5A, FIG. 5B and FIG. 5C illustrate the measurement results obtained for a probe oriented along two directions at 90° with respect to each other, so as to be equivalent to a probe according to an embodiment.
Figure 5B:
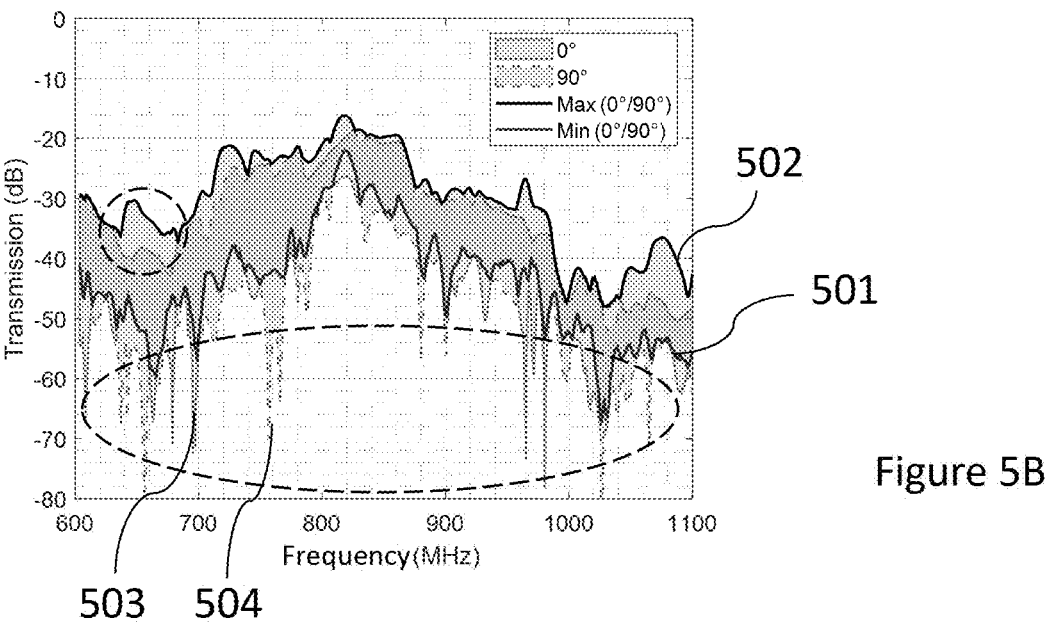
Figure 5C:
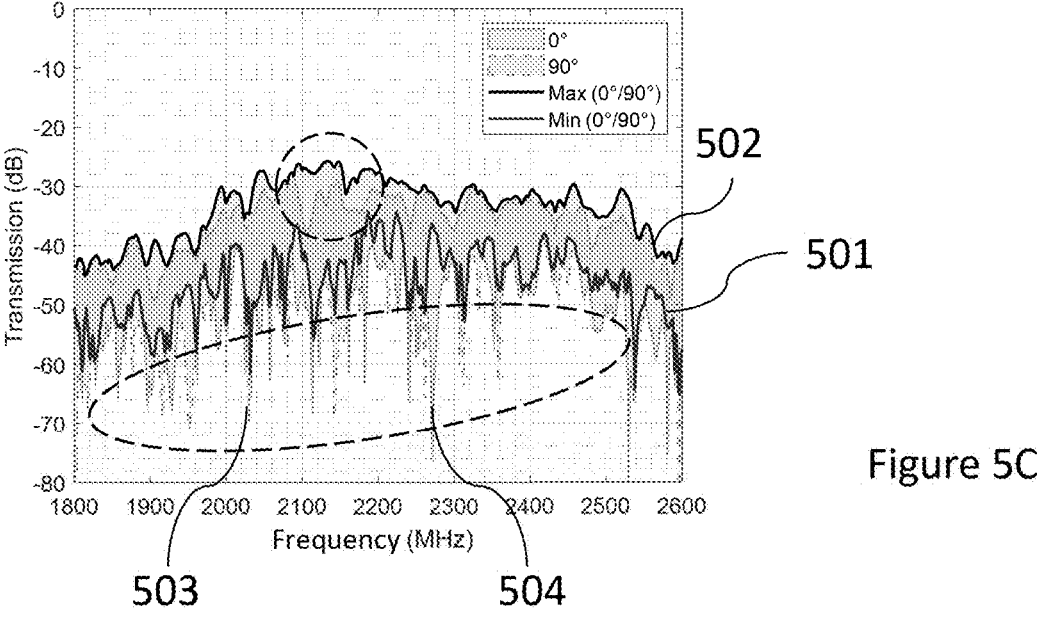

FIGS. 5A to 5C illustrate the measurement results obtained for a probe oriented along two orientations at 90° with respect to each other to be equivalent to a probe according to an embodiment, compared with measurement results obtained for probes of the state of the art, and this, within a cylindrical metal cavity having a 336-millimeter diameter.

For each graph, the abscissa represents the operating frequency of each considered probe. The ordinate represents the transmission loss in dB between a transmitting antenna placed at one point of the cavity and the considered probe at different points of the cavity. In FIGS. 5A to 5C, curves 501 and 502 show the minimum and maximum transmission levels between a transmitting antenna and the probe according to an embodiment, curves 501 showing the minimum levels and curves 502 showing the maximum levels. Other graphs 503, 504 show results obtained with probes of the state of the art positioned along two orientations orthogonal to each other.

FIG. 5A illustrates the measurement results obtained for frequencies in the range from 300 to 500 MHz. FIG. 5B illustrates the measurement results obtained for frequencies in the range from 600 to 1,100 MHz. FIG. 5C illustrates the measurement results obtained for frequencies in the range from 1,800 to 2,600 MHz.

The more the frequency increases, the more higher-order modes appear and the less the electric and magnetic fields become homogeneous in the cavity, which results in more transmission drops (nulls) in the graphs 503, 504 of probes of the state of the art.

On the other hand, curves 501, 502 show that the probe according to an embodiment enables to compensate for these transmission losses, even for very high frequencies. The areas surrounded in dotted lines correspond to examples of areas where the probe significantly improves the transmission as compared with probes of the state of the art.

Figure 6A:
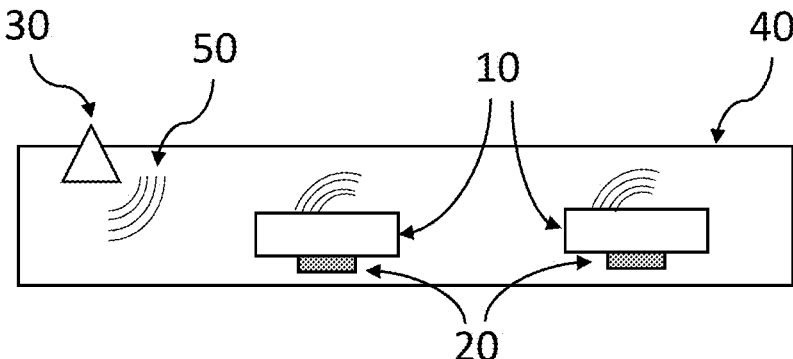
FIG. 6A illustrates a first example of use of a probe according to an embodiment.
Figure 6B:
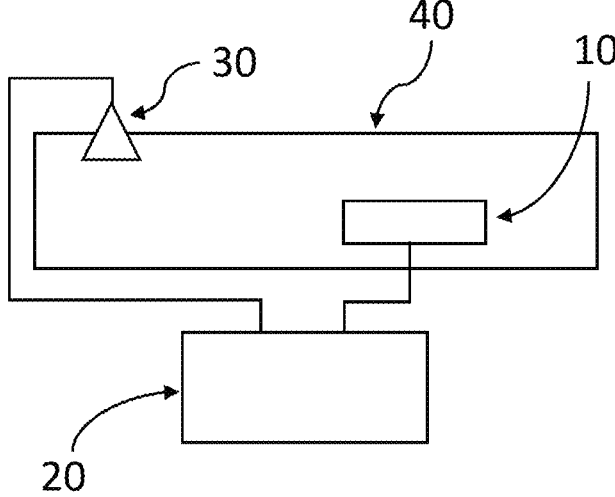
FIG. 6B illustrates a second example of use of a probe according to an embodiment.
Figure 6C:
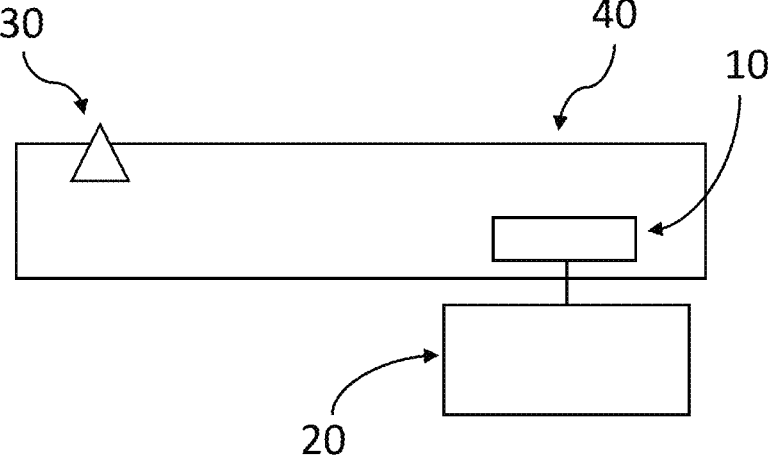
FIG. 6C illustrates a third example of use of a probe according to an embodiment.

FIGS. 6A, 6B and 6C illustrate three examples of use of a probe according to an embodiment.

In the first example illustrated in FIG. 6A, a component 20 (for example, a sensor or an RFIC chip) is coupled to a probe 10 according to an embodiment, the probe-component assembly being in a cavity 40. Further, an antenna 30 is adapted to transmitting electromagnetic waves 50 in cavity 40 in order to communicate with the component coupled to the probe. Modes are established in the cavity, the electromagnetic field is captured by the probe, which may backscatter the data from the component to antenna 30. In this example, the component is arranged under the probe, in contact therewith.

In the second example illustrated in FIG. 6B, a component 20 is coupled by a connector to a probe 10 according to an embodiment, only the probe is in a cavity 40. Further, an antenna 30 is adapted to transmitting electromagnetic waves 50 in cavity 40, and is also coupled by a connector to component 20. Modes are established in the cavity, the electromagnetic field generated by antenna 30 (respectively probe 10) is captured by probe 10 (respectively antenna 30) in order to perform, for example, transmission measurements.

In the third example illustrated in FIG. 6C, a component 20 is coupled by a connector to a probe 10 according to an embodiment, only the probe is in a cavity 40. Further, an antenna 30 is adapted to transmitting electromagnetic waves 50 in cavity 40. An object of this configuration is for example to measure the field emitted by antenna 30 in order to map the value of the electromagnetic field components for any position of probe 10 in the cavity.

In each of the described examples of application, it is possible to use a plurality of probes in the cavity. Further, the illustrated cavity may be closed or partially closed.

Among possible applications of a magnetic field probe according to the various embodiments, one can mention:

metrology: for example, near-field measurements;

communication: for example, the wireless transmission of information in cavities of large dimensions;

microwave frequencies: for example, for the excitation of electromagnetic fields in waveguides on higher modes.

Various embodiments and variants have been described. Those skilled in the art will understand that certain features of these various embodiments and variants may be combined, and other variants will occur to those skilled in the art. In particular, the ground plane and the capacitive roof are shown as having the same surface area. Alternatively, the ground plane may have a larger surface area than the capacitive roof, or the capacitive roof may have a larger surface area than the ground plane. Further, the capacitive roof does not necessarily comprise a slot.

Finally, the practical implementation of the described embodiments and variants is within the abilities of those skilled in the art based on the functional indications given hereabove.

What is claimed is:

1. Electromagnetic field probe extending along a main plane and comprising:

an electrically-conductive ground plane; an electrically-conductive capacitive roof, arranged at a distance from the ground plane;

the ground plane and the capacitive roof being separated, at least over a portion of their interface, by a dielectric material;

at least three electrically-conductive vias extending through the dielectric material, each of said at least three vias being either an excitation via electrically coupled to the capacitive roof, electrically insulated from the ground plane and intended to be coupled to an electric power source, or a grounding via electrically coupling the ground plane and the capacitive roof, the at least three vias comprising at least one excitation via and at least one grounding via;

the at least three vias being arranged so as to form, when the at least one excitation via is powered, a first current loop and a second current loop, each current loop extending in the plane of the capacitive roof and in a direction substantially orthogonal to said capacitive roof through at least one of said at least three vias, so as to be sensitive to a magnetic field substantially parallel to the plane of the capacitive roof, the first and second current loops having directions substantially orthogonal to each other in the plane of the capacitive roof;

the height of said probe being lower than one thirtieth of the wavelength of use of said probe.

2. Probe according to claim 1, the at least three electrically-conductive vias comprising an excitation via, a first grounding via, and a second grounding via, the first current loop running between the excitation via, the capacitive roof, and the first grounding via, the second current loop running between the excitation via, the capacitive roof, and the second grounding via.

3. Probe according to claim 2, the straight line coupling a connection point of the first grounding via in the plane of the capacitive roof and a connection point of the excitation via in the plane of the capacitive roof being substantially orthogonal to the straight line coupling a connection point of the second grounding via in the plane of the capacitive roof and a connection point of the excitation via in the plane of the capacitive roof.

4. Probe according to claim 1, the at least three electrically-conductive vias comprising a grounding via, a first excitation via, and a second excitation via, the first current loop running between the first excitation via, the capacitive roof, and the grounding via, the second current loop running between the second excitation via, the capacitive roof, and the grounding via.

5. Probe according to claim 4, the straight line coupling a connection point of the first excitation via in the plane of the capacitive roof and a connection point of the grounding via in the plane of the capacitive roof being substantially orthogonal to the straight line coupling a connection point of the second excitation via in the plane of the capacitive roof and a connection point of the grounding via in the plane of the capacitive roof.

6. Probe according to claim 1, comprising a slot formed by an opening crossing the entire thickness of the capacitive roof.

7. Probe according to claim 6, the slot exhibiting an axial symmetry with respect to a straight line running through the connection point of the excitation via in the plane of the capacitive roof and running substantially at an equal distance from the connection point of the first grounding via in the plane of the capacitive roof and from the connection point of the second grounding via in the plane of the capacitive roof.

8. Probe according to claim 6, the slot exhibiting an axial symmetry with respect to a line running through the connection point of the grounding via in the plane of the capacitive roof and running substantially at an equal distance from the connection point of the first excitation via in the plane of the capacitive roof and from the connection point of the second excitation via in the plane of the capacitive roof.

9. Probe according to claim 1, further comprising at least one complementary electrically-conductive via, the at least one complementary via being a complementary grounding via or a complementary excitation via.

10. Probe according to claim 1, the dielectric material being air.

11. Probe according to claim 1, the dielectric material being a substrate, for example an organic substrate or a ceramic substrate.

12. Probe according to claim 1, the dimensions of said probe in the main plane being smaller than one quarter of the wavelength of use of said probe, for example in the range from one twentieth to one quarter of the wavelength of use of said probe, or even in the range from one twentieth to one tenth of the wavelength of use of said probe, or from one twentieth to one fifteenth of the wavelength of use of said probe.

13. Probe according to claim 1, the height of said probe being in the range from one hundredth to one thirtieth of the wavelength of use of said probe, or even in the range from one hundred and fifth to one thirtieth of the wavelength of use of said probe.

14. Probe according to claim 1, the ground plane being parallel to the capacitive roof.

15. Method of manufacturing an electromagnetic field probe comprising:

a step of provision of an electrically-conductive ground plane;

a step of provision of an electrically-conductive capacitive roof;

a step of arrangement of the capacitive roof at a distance from the ground plane so that the height of the probe is smaller than one thirtieth of the wavelength of use of said probe;

a step of coupling of at least one excitation via to the capacitive roof, said at least one excitation via being electrically insulated from the ground plane;

a step of coupling of at least one grounding via to the ground plane and to the capacitive roof;

the number of excitation and grounding vias being at least equal to three;

said excitation and grounding vias being arranged so as to form, when an excitation via is powered, a first current loop and a second current loop, each current loop extending in the plane of the capacitive roof and in a direction substantially orthogonal to said capacitive roof, so as to be sensitive to a magnetic field substantially parallel to the plane of the capacitive roof, the first and second current loops having directions substantially orthogonal to each other in the plane of the capacitive roof.

* * * * *